(12) United States Patent
Hsieh

(10) Patent No.: US 7,496,873 B2
(45) Date of Patent: Feb. 24, 2009

(54) METHOD AND SYSTEM FOR DETERMINING REQUIRED QUANTITY OF TESTING POINTS ON A CIRCUIT LAYOUT DIAGRAM

(75) Inventor: Hsiang-Yi Hsieh, Taipei (TW)

(73) Assignee: Inventec Corporation, Taipei (TW)

( * ) Notice: Subject to any disclaimer, the term of this patent is extended or adjusted under 35 U.S.C. 154(b) by 147 days.

(21) Appl. No.: 11/557,833

(22) Filed: Nov. 8, 2006

(65) Prior Publication Data

US 2008/0028346 A1 Jan. 31, 2008

(30) Foreign Application Priority Data

Jul. 27, 2006 (TW) .............................. 95127443 A

(51) Int. Cl.
*G06F 17/50* (2006.01)
(52) U.S. Cl. ........................................... 716/4; 716/15
(58) Field of Classification Search ...................... 716/4, 716/15
See application file for complete search history.

(56) References Cited

U.S. PATENT DOCUMENTS

2001/0039644 A1 * 11/2001 Le Coz ........................ 716/11
2004/0139407 A1 * 7/2004 Mukai et al. ................... 716/4

* cited by examiner

*Primary Examiner*—Thuan Do
*Assistant Examiner*—Magid Y Dimyan

(57) ABSTRACT

A method and system is proposed for determining the required quantity of testing points on a circuit layout diagram generated by a computer-aided circuit layout design program on a computer platform. The proposed method and system is characterized by the use of a graphic file scanning method for finding and totaling the number of all the electrical connecting points associated with each electronic component in the circuit layout diagram, whereby the required quantity of testing points is determined based on the total of the electrical connecting points. The determined quantity of testing points is then informed to the user by displaying it in a human-readable form on the computer platform. This feature allows circuit layout design to be less laborious and time-consuming and thus more efficient than prior art.

8 Claims, 4 Drawing Sheets

METHOD AND SYSTEM FOR DETERMINING REQUIRED QUANTITY OF TESTING POINTS ON A CIRCUIT LAYOUT DIAGRAM

CROSS REFERENCE TO RELATED APPLICATION(S)

This application claims the benefit of Taiwan patent application no. 095127443 filed Jul. 27, 2006, of which is incorporated for reference in its entirety.

BACKGROUND OF THE INVENTION

1. Field of the Invention

This invention relates to information technology (IT), and more particularly, to a circuit layout diagram testing point quantity determining method and system which is designed for use in conjunction with a computer platform for determining the required quantity of testing points for each electronic component on a circuit layout diagram that is created by using a CAD (Computer-Aided Design) circuit layout design program.

2. Description of Related Art

In the industry of electronics, the design of circuit boards typically utilizes a CAD (Computer-Aided Design) software program to draw the required circuit layout diagrams which are then used in automated processes to control the manufacture of circuit boards. The Allegro software system developed by the Cadence Corporation of USA, for example, is a widely employed CAD program that can help manufacturers in the layout design of circuit boards.

In practice, a computer motherboard or expansion card is typically incorporated with electronic components that include multiple electrical contact points, such as an integrated circuit chip with a BGA (Ball Grid Array) or a connector with an array of pins. These electrical contact points are typically categorized into signal I/O (input/output) points and grounding points, where the signal I/O points are used for receiving logic-HIGH voltage signals (typically a 1.5 V signal) and logic-LOW voltage signals (typically a 0 V signal), and the grounding points are used for connection with the ground (GND). In order to facilitate the testing of the signal I/O points and grounding points of each component, it is a common practice to add some testing points to the component, so that when the circuit board is fabricated, test engineers can carry out testing operations through these testing points. As standard criteria, the quantity of testing points is predefined to be one for every set of 30 electrical contact points (for both the grounding points and the signal I/O points). Accordingly, if a component has a total of 108 grounding points and 90 signal I/O points, it is required to add a quantity of 4 test points for the grounding points and a quantity of 3 test points for the signal I/O points.

Presently, a conventional method used by the Allegro CAD system for determining the required quantity of testing points on the circuit layout diagram of a BGA IC chip is to display all the grounding points and the signal I/O points in particular colors, such as displaying all the grounding points in green and all the signal I/O points in blue, so as to allow the user to visually count the total numbers of the grounding points and the signal I/O points, and then mentally calculating the required quantity of testing points based on the predefined criteria.

One drawback to the above-mentioned practice, however, is that a typical BGA IC chip could contain an array of several hundreds of electrical contact points; and therefore, it is quite tedious, laborious, and time-consuming for the user to visually and mentally determine the required quantity of testing points. In addition, it is more likely prone to error.

SUMMARY OF THE INVENTION

It is therefore an objective of this invention to provide a circuit layout diagram testing point quantity determining method and system which is capable of automatically count the total numbers of electrical contact points of BGA IC chips and other components in a circuit layout diagram and automatically calculate the required quantity of testing points, so as to make the circuit layout work more convenient and efficient.

The circuit layout diagram testing point quantity determining method and system according to the invention is designed for use in conjunction with a computer platform that runs a CAD circuit layout design program, such as the Allegro CAD system, for determining the required quantity of testing points in a circuit layout diagram created by the CAD system.

The circuit layout diagram testing point quantity determining method comprises: (S1) responding to a user-initiated activation event by issuing a testing-point calculation requesting message; (S2) responding to the testing-point calculation requesting message by performing a scanning on the circuit layout diagram to find all the electrical contact points that are associated with the electronic component in the circuit layout diagram; (S3) counting the total number of the electrical contact points; (S4) deciding a corresponding quantity of testing points based on the total count of the electrical contact points in accordance with predefined criteria; and (S5) outputting the result of the quantity of testing points in a human-perceivable message form on the computer platform.

In concrete architecture, the circuit layout diagram testing point quantity determining system according to the invention comprises: (A) a user interface module, which is used to provide a user-initiated activation function, and which is capable of responding to each user-initiated activation event by issuing a testing-point calculation requesting message; (B) a circuit layout scanning module, which is capable of responding to the testing-point calculation requesting message from the user interface module by performing a scanning on the circuit layout diagram to find all the electrical contact points that are associated with each electronic component in the circuit layout diagram; (C) an electrical contact point counting module, which is capable of counting the total number of the electrical contact points found by the circuit layout scanning module; (D) a testing-point quantity deciding module, which is capable of deciding a corresponding quantity of testing points based on the total count of the electrical contact points determined by the electrical contact point counting module; and (E) a result outputting module, which is capable of outputting the result of the quantity of testing points decided by the testing-point quantity deciding module in a human-perceivable message form on the computer platform.

The circuit layout diagram testing point quantity determining method and system according to the invention is characterized by the use of a graphic file scanning method for finding and totaling the number of all the electrical connecting points associated with each electronic component in the circuit layout diagram, whereby the required quantity of testing points is determined based on the total of the electrical connecting points. The determined quantity of testing points is then informed to the user by displaying it in a human-readable form on the computer platform. This feature allows circuit layout design to be less laborious and time-consuming and thus more efficient than prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The circuit layout diagram testing point quantity determining method and system according to the invention is disclosed in full details by way of preferred embodiments in the following with reference to the accompanying drawings.

Figure 1:
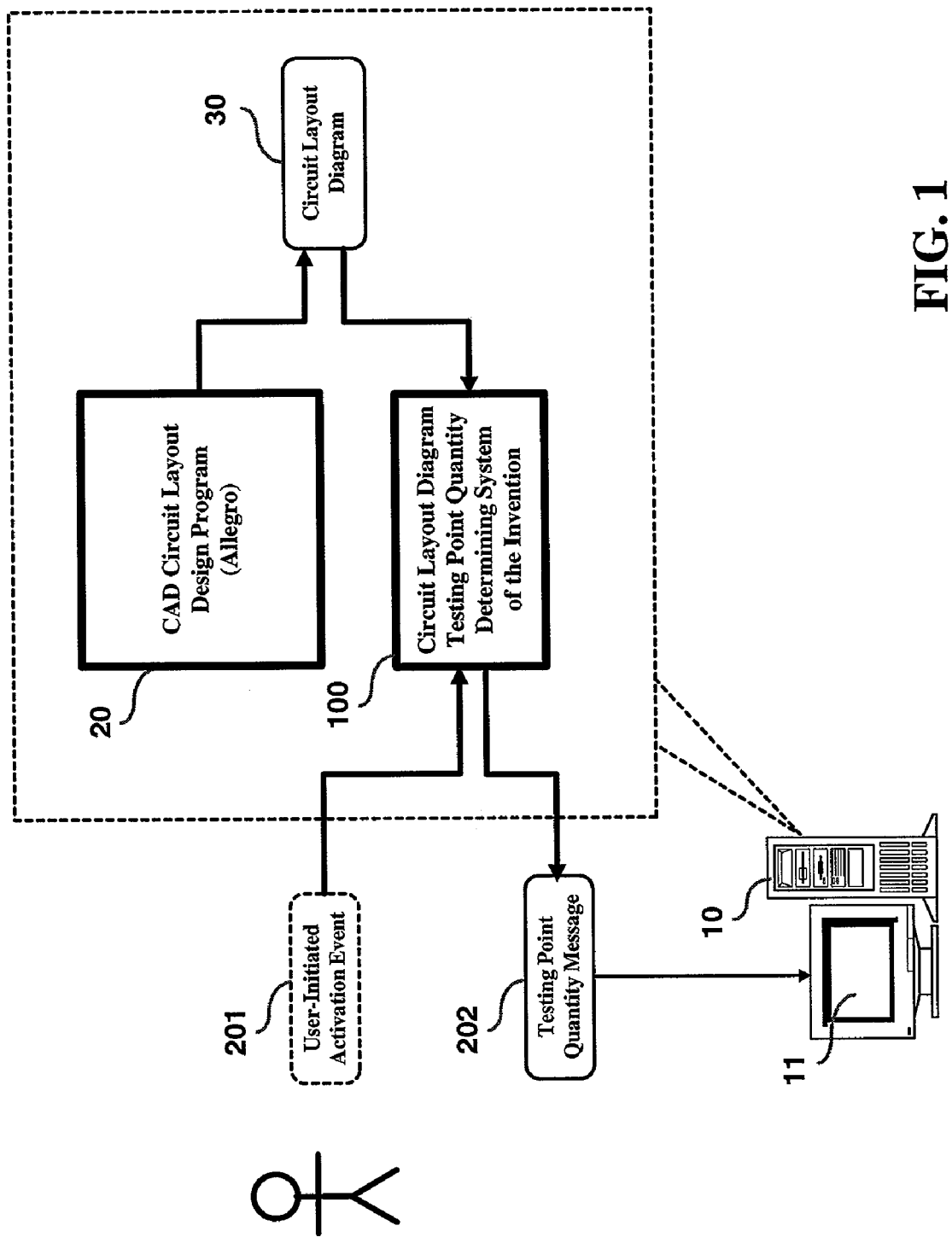
FIG. 1 is a schematic diagram showing the application of the circuit layout diagram testing point quantity determining system of the invention with a computer platform.

FIG. 1 is a schematic diagram showing the application of the circuit layout diagram testing point quantity determining system according to the invention (which is here encapsulated in a box indicated by the reference numeral 100). As shown, the circuit layout diagram testing point quantity determining system of the invention 100 is designed for use in conjunction with a computer platform 10, such as a network server, a desktop computer, or a notebook computer, that is installed with a CAD (Computer-Aided Design) circuit layout design program 20, such as the Allegro software system developed by the Cadence Corporation of USA. Functionally, the circuit layout diagram testing point quantity determining system of the invention 100 is capable of performing a testing point quantity determining function for determining the required quantity of testing points that should be added to a circuit layout diagram 30 created by the CAD circuit layout design program 20, so that when a circuit board is actually manufactured from the circuit layout diagram 30, the testing points can be used to test the operability of the circuit board.

In practical applications, for example, the circuit layout diagram 30 contains one or more electronic components that are associated with an array of electrical contact points, such as an IC (integrated circuit) chip 40 and a connector 50; where the IC chip 40 is associated with a multiplicity of BGA (Ball Grid Array) contact points, including a subgroup of grounding points 42 and a subgroup of signal I/O points 43; while the connector 50 is associated with an array of electrical contact points 51.

Figure 2:
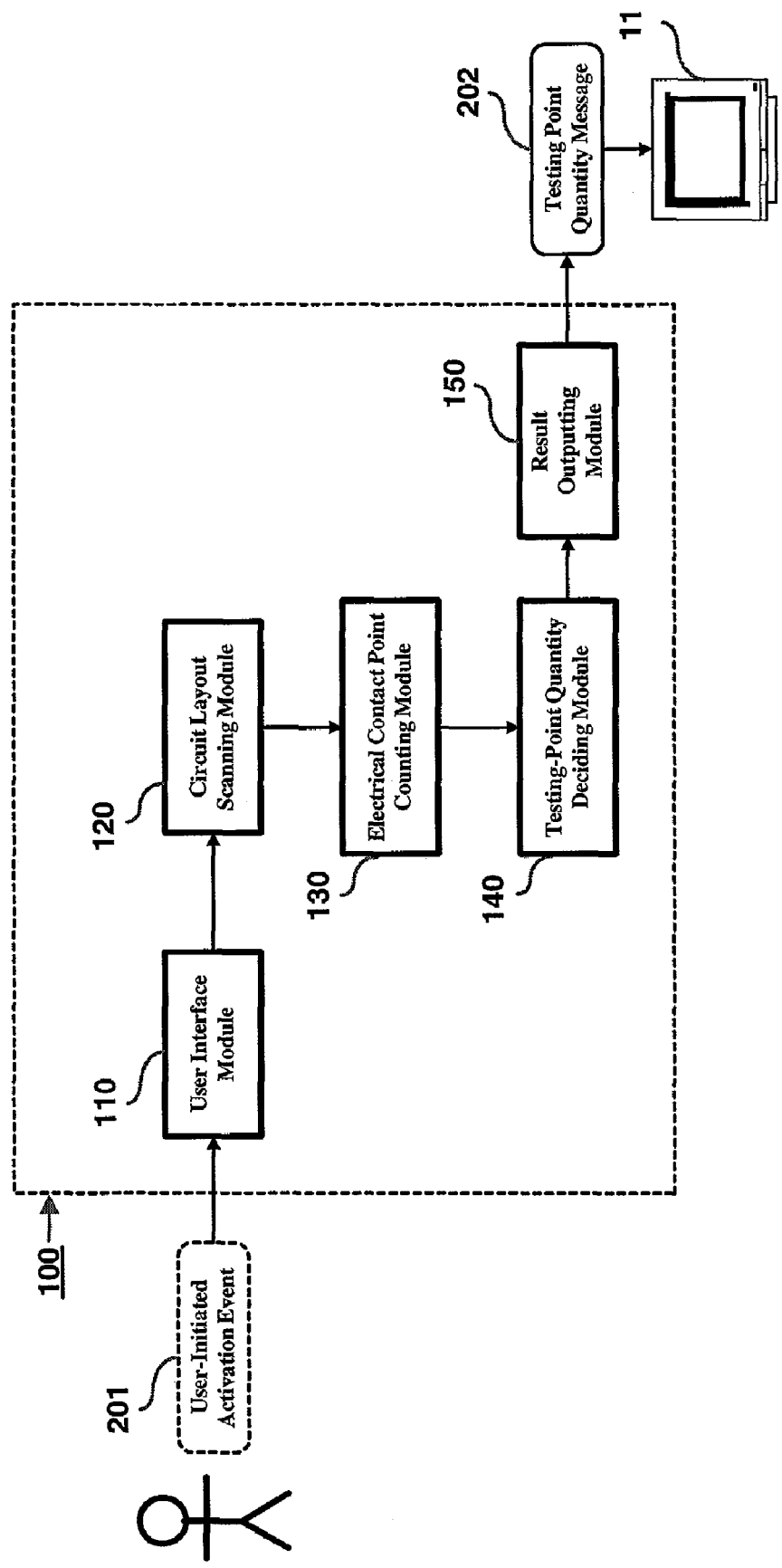
FIG. 2 is a schematic diagram showing an object-oriented component model of the circuit layout diagram testing point quantity determining system of the invention.

As shown in FIG. 2, in architecture, the circuit layout diagram testing point quantity determining system of the invention 100 comprises: (A) a user interface module 110; (B) a circuit layout scanning module 120; (C) an electrical contact point counting module 130; (D) a testing-point quantity deciding module 140; and (E) a result outputting module 150. In practical implementation, for example, the circuit layout diagram testing point quantity determining system of the invention 100 can be realized as an add-on module for integration to the Allegro CAD circuit layout design program 20.

Firstly, the respective attributes and functions (i.e., methods) of the constituent components 110, 120, 130, 140, 150 of the circuit layout diagram testing point quantity determining system of the invention 100 are described in details in the following.

Figure 3:
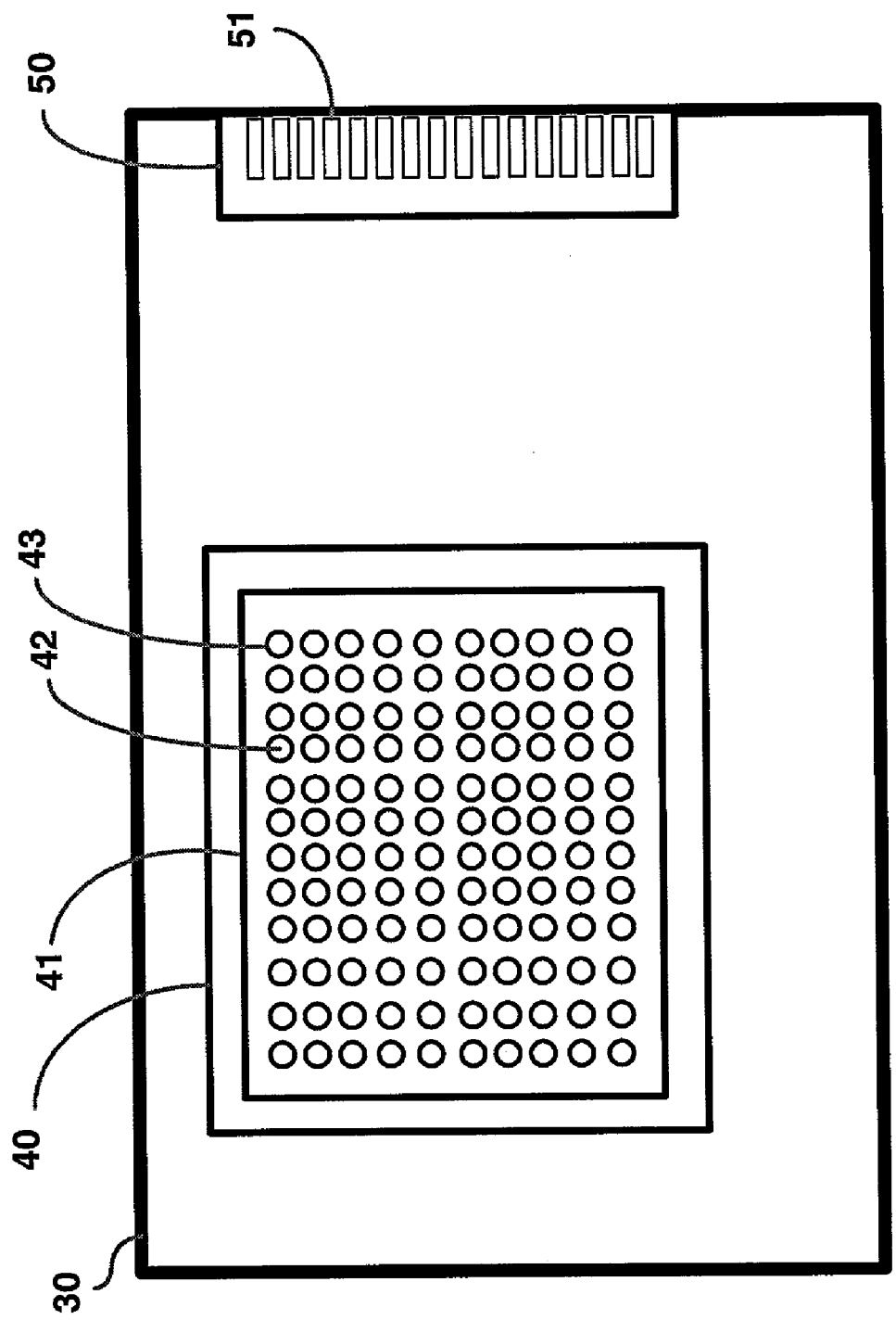
FIG. 3 is a schematic diagram showing an example of a circuit layout diagram.

The user interface module 110 is used to provide a user interface on the computer platform 10 for the user to interact with the system of the invention 100. During actual operation, the user interface module 110 is capable of responding to each user-initiated activation event 201 by issuing a testing-point calculation requesting message to the circuit layout scanning module 120. In practical implementation, for example, the activation event 201 can be user-initiated by selecting an electronic component from the circuit layout diagram 30 as target, such as the IC chip 40 shown in FIG. 3, and then clicking an activation button or a menu command; and the user interface module 110 will respond to this user-initiated activation event 201 by issuing a testing-point calculation requesting message to the circuit layout scanning module 120.

The circuit layout scanning module 120 is designed to respond to the testing-point calculation requesting message from the user interface module 110 by performing a scanning on the circuit layout diagram 30 to find all the electrical contact points that are defined in association with the user-selected electronic component in the circuit layout diagram 30. In the case of the IC chip 40, these electrical contact points include all the grounding points 42 and the signal I/O points 43. At each time the circuit layout scanning module 120 finds the description data of one electrical contact point, it will issue a count enable message to the electrical contact point counting module 130.

The electrical contact point counting module 130 is capable of responding to each count enable message from the circuit layout scanning module 120 by counting the total number of the electrical contact points (including all grounding points 42 and signal I/O points 43) found by the circuit layout scanning module 120. The total count of electrical contact points is then transferred via a message to the testing-point quantity deciding module 140.

The testing-point quantity deciding module 140 is capable of responding to the message from the electrical contact point counting module 130 by deciding a corresponding quantity of testing points based on the total count of the electrical contact points counted by the electrical contact point counting module 130. In practical implementation, for example, the quantity of testing points is predefined to be one for every set of 30 electrical contact points (for both the grounding points and the signal I/O points). Accordingly, if the BGA 41 of the IC chip 40 contains a total of 108 grounding points and 90 signal I/O points, then the testing-point quantity deciding module 140 will assign a quantity of 4 test points for the grounding points and a quantity of 3 test points for the signal I/O points.

The result outputting module 150 is capable of outputting the result of the quantity of testing points decided by the testing-point quantity deciding module 140 in a human-perceivable message form on the monitor screen 11 of the computer platform 10. In practical implementation, for example, the result outputting module 150 shows the message of testing point quantity 202 in text form at the left-bottom corner of the circuit layout diagram 30 on the monitor screen 11 of the computer platform 10.

The following is a detailed description of a practical application example of the circuit layout diagram testing point quantity determining system of the invention 100 during actual operation.

Figure 4:
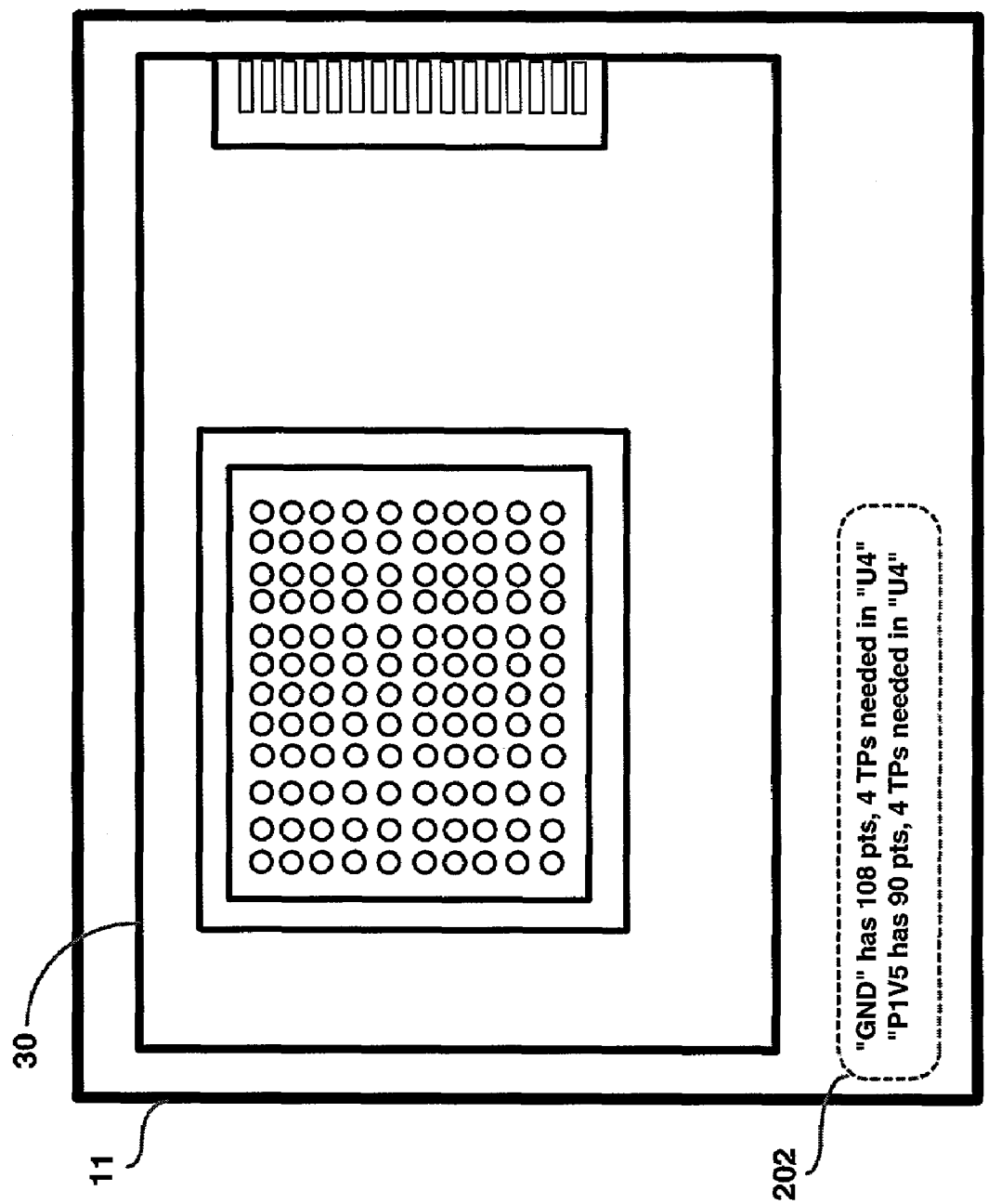
FIG. 4 is a schematic diagram showing a screen display that shows a message of the result of testing point quantity determined by the circuit layout diagram testing point quantity determining system of the invention.

In practical use, when the user (i.e., circuit design engineer) completes the drawing of a circuit layout diagram 30, he/she can then start the circuit layout diagram testing point quantity determining system of the invention 100 to determine the quantity of testing points that are to be added to the circuit layout diagram 30. To do this, the user needs first to utilize the user interface module 110 to select a component from the circuit layout diagram 30 (in this example, assume the IC chip 40 is selected), and then clicking an activation button or a menu command (not shown) to activate the user interface module 110 to respond to this user-initiated activation event 201 by issuing a testing-point calculation requesting message to the circuit layout scanning module 120. In response, the circuit layout scanning module 120 performs a scanning on the circuit layout diagram 30 to find all the electrical contact points that are defined in association with the user-selected IC chip 40) from the circuit layout diagram 30, which include all the grounding points 42 and the signal I/O points 43 in the BGA 41 of the IC chip 40. Each time the circuit layout scanning module 120 finds the description data of one electrical contact point, it will issue a count enable message to the electrical contact point counting module 130 to activate the electrical contact point counting module 130 to count the total number of the grounding points 42 and signal I/O points 43 found by the circuit layout scanning module 120. The total count of electrical contact points is then transferred via a message to the testing-point quantity deciding module 140. In response, the testing-point quantity deciding module 140 decides a corresponding quantity of testing points based on the total count of the grounding points 42 and signal I/O points 43. Assume the quantity of testing points is predefined to be one for every set of 30 electrical contact points. Accordingly, if the BGA 41 of the IC chip 40 contains a total of 108 grounding points and 90 signal I/O points, then the testing-point quantity deciding module 140 will assign a quantity of 4 test points for the grounding points and a quantity of 3 test points for the signal I/O points. After this, the result outputting module 150 is activated to output the result of the quantity of testing points 202 in a human-perceivable message form on the monitor screen 11 of the computer platform 10, such as a text message displayed at the left-bottom corner of the circuit layout diagram 30 as illustrated in FIG. 4. By reading this message of testing point quantity 202, the user can learn how many testing points are to be added to the BGA 41 of the IC chip 40.

In conclusion, the invention provides a circuit layout diagram testing point quantity determining method and system which is designed for use with a computer platform for determining the required quantity of testing points for each of the electronic components on a CAD-created circuit layout diagram, and which is characterized by the use of a graphic file scanning method for finding and totaling the number of all the electrical connecting points associated with each electronic component in the circuit layout diagram, whereby the required quantity of testing points is determined based on the total of the electrical connecting points. The determined quantity of testing points is then informed to the user by displaying it in a human-readable form on the computer platform. This feature allows circuit layout design to be less laborious and time-consuming and thus more efficient than prior art. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A circuit layout diagram testing point quantity determining method for use with a computer platform for determining required quantity of testing points on a CAD-created circuit layout diagram which draws at least one electronic component associated with a group of electrical contact points;

the circuit layout diagram testing point quantity determining method comprising:

responding to a user-initiated activation event by issuing a testing-point calculation requesting message;

responding to the testing-point calculation requesting message by performing a scanning on the circuit layout diagram to find all the electrical contact points that are associated with the electronic component in the circuit layout diagram;

counting the total number of the electrical contact points;

deciding a corresponding quantity of testing points based on the total count of the electrical contact points in accordance with predefined criteria; and outputting the result of the quantity of testing points in a human-perceivable message form on the computer platform.

2. The circuit layout diagram testing point quantity determining method of claim 1, wherein the electrical contact point group includes a subgroup of grounding points and a subgroup of signal I/O points, and the testing-point quantity deciding module decides a corresponding quantity of testing points for the grounding points and a corresponding quantity of testing points for the signal I/O points.

3. The method and system for determining required quantity of testing points on a circuit of claim 1, wherein the electronic component is an integrated circuit chip having a BGA (Ball Grid Array) of electrical contact points.

4. The method and system for determining required quantity of testing points on a circuit of claim 1, wherein the electronic component is a connector.

5. A circuit layout diagram testing point quantity determining system for use with a computer platform for determining required quantity of testing points on a CAD-created circuit layout diagram which draws at least one electronic component associated with a group of electrical contact points;

the circuit layout diagram testing point quantity determining system comprising:

a user interface module, which is used to provide a user-initiated activation function, and which is capable of responding to each user-initiated activation event by issuing a testing-point calculation requesting message;

a circuit layout scanning module, which is capable of responding to the testing-point calculation requesting message from the user interface module by performing a scanning on the circuit layout diagram to find all the electrical contact points that are associated with each electronic component in the circuit layout diagram;

an electrical contact point counting module, which is capable of counting the total number of the electrical contact points found by the circuit layout scanning module;

a testing-point quantity deciding module, which is capable of deciding a corresponding quantity of testing points based on the total count of the electrical contact points determined by the electrical contact point counting module; and a result outputting module, which is capable of outputting the result of the quantity of testing points decided by the testing-point quantity deciding module in a human-perceivable message form on the computer platform.

6. The circuit layout diagram testing point quantity determining system of claim 5, wherein the electrical contact point group includes a subgroup of grounding points and a subgroup of signal I/O points, and the testing-point quantity deciding module decides a corresponding quantity of testing points for the grounding points and a corresponding quantity of testing points for the signal I/O points.

7. The circuit layout diagram testing point quantity determining system of claim 5, wherein the electronic component is an integrated circuit chip having a BGA (Ball Grid Array) of electrical contact points.

8. The circuit layout diagram testing point quantity determining system of claim 5, wherein the electronic component is a connector.

* * * * *